United States Patent
Park

[11] Patent Number: 5,991,227
[45] Date of Patent: Nov. 23, 1999

[54] CLOCK SYNC LATCH CIRCUIT

[75] Inventor: Jin Nam Park, Kyoungki-do, Rep. of Korea

[73] Assignee: Hyundai Electronics Industries Co., Ltd., Kyoungki-Do, Rep. of Korea

[21] Appl. No.: 09/108,172

[22] Filed: Jul. 1, 1998

[30] Foreign Application Priority Data

Jun. 30, 1997 [KR] Rep. of Korea ............ 97-30214

[51] Int. Cl.$^6$ ............................................. G11C 8/00
[52] U.S. Cl. ............................ 365/230.08; 365/189.05; 365/233
[58] Field of Search ................... 365/230.08, 189.05, 365/190, 233

[56] References Cited

U.S. PATENT DOCUMENTS

| | | | |
|---|---|---|---|
| 4,797,574 | 1/1989 | Okubo et al. | 307/269 |
| 4,916,670 | 4/1990 | Suzuki et al. | 356/233 |
| 5,191,239 | 3/1993 | Rogers | 307/445 |
| 5,321,399 | 6/1994 | Notani et al. | 341/100 |
| 5,619,157 | 4/1997 | Kumata et al. | 327/203 |
| 5,726,950 | 3/1998 | Okamoto et al. | 365/233 |
| 5,781,499 | 7/1998 | Koshikawa | 365/233 |
| 5,856,941 | 1/1999 | Keyse et al. | 365/154 |

*Primary Examiner*—David Nelms
*Assistant Examiner*—Hien Nguyen
*Attorney, Agent, or Firm*—Thelen Reid & Priest LLP

[57] ABSTRACT

The present invention discloses a latch circuit used when latching an address signal or a control signal of a semiconductor memory device. In particular, the present invention discloses a clock sync latch circuit which is separately implemented to input two input signals having opposite polarities so that respective outputs corresponding to the two inputs can be outputted from each of the rising and falling edges of one clock signal. Therefore, though a skew occurs when a memory chip operates at high frequency, the number of collision between the data according to the clock signal can be prevented since it is synchronized by the same clock signal, thus preventing a malfunction of the memory chip. Also, it can obtain a large margin in the design area since only a single latch circuit can be employed.

4 Claims, 2 Drawing Sheets

CLOCK SYNC LATCH CIRCUIT

BACKGROUND OF THE INVENTION

1. Field of the Invention

The present invention relates to a latch circuit used to latch address signals or control signals of a semiconductor memory device. In particular, the present invention relates to a clock sync latch circuit by which input signals opposite in polarity to each other are outputted from each of the rising and falling edges of one clock.

2. Description of the Prior Art

Below, a conventional latch circuit will be explained in detail with reference to the attached drawings.

FIG. 1 shows a conventional latch circuit, which includes a first differential amplify circuit section 10 to the gate of which a clock signal is applied; a second differential amplify circuit section 20 to the gate of which an inverted clock signal is applied; and a data select circuit section 30 for selecting any one output of the two outputs of the first and second differential amplify circuit sections 10 and 20 to output it.

In FIG. 1, the first differential amplify circuit section 10 consists of first and second P channel MOS transistors MP1 and MP2, which are connected with a cross couple structure between the power supply Vcc; a first node N1 and a second node N2; a first N channel MOS transistor MN1 to the gate of which is applied an input voltage Vin and connected between the first node N1 and a third node N3; a second N channel MOS transistor MN2 to the gate of which a reference voltage Vref is applied and connected between the second node N2 and the third node N3; and a third N channel MOS transistor MN3 to the gate of which a clock signal CLOCK is applied and connected between the third node N3 and the ground voltage Vss. The second differential amplify circuit section 20 is consisted of third and fourth P channel MOS transistors MP3 and MP4, which are connected with a cross couple structure between the power supply Vcc, a fourth node N4 and a fifth node N5; a fourth N channel MOS transistor MN4 to the gate of which the input voltage Vin is applied and connected between the fourth node N4 and a sixth node N6; a fifth N channel MOS transistor MN5 to the gate of which the reference voltage Vref is applied and connected between the fifth node N5 and the sixth node N6; and a sixth N channel MOS transistor MN6 to the gate of which an inverted clock signal /CLOCK is applied the wherein the clock signal CLOCK is inverted by an inverter I1 and connected between the sixth node N6 and the ground voltage Vss. Also, the data select circuit section 30 selects any one of the output N2 of the first differential amplify circuit section 10 or the output N5 of the second differential amplify circuit section 20 to output it.

The operation of the conventional latch circuit as constructed above is as follows.

When the clock signal CLOCK is HIGH, the second differential amplify circuit section 20 does not operate. Instead, only the first differential amplify circuit section 10 operates. If the input voltage Vin of the first differential amplify circuit section 10 is higher than the reference voltage Vref, the first, third N channel MOS transistors MN1, MN3 are turned-on and the voltage level of the first node N1 becomes LOW to turn on the second P channel MOS transistor MN2 having a cross couple structure. Therefore, the voltage level of the second node N2 becomes HIGH and inputted to the data select circuit section 30. However, if the input voltage Vin is lower than the reference voltage Vref, the voltage level of the second node N2 becomes LOW and inputted to the data select circuit section 30.

On the other hand, when the clock signal CLOCK is LOW, the first differential amplify circuit section 10 does not operate. Only the second differential amplify circuit section 20 operates. If the input voltage Vin of the second differential amplify circuit section 20 is higher than the reference voltage Vref, the fourth, sixth N channel MOS transistors MN4 and MN6 are turned-on and the voltage level of the fourth node N4 becomes LOW to turn on the fourth P channel MOS transistor MN4 having a cross couple structure. Therefore, the voltage level of the fifth node N5 becomes HIGH and inputted to the data select circuit section 30. However, if the input voltage Vin is lower than the reference voltage Vref, the voltage level of the fifth node N5 becomes LOW and inputted to the data select circuit section 30.

However, as described above, the conventional latch circuit needs two latch circuits which are synchronized by means of the two clock signal CLOCK, /CLOCK which have opposite polarities each other so that one input signal is inputted to output data from the rising and falling edges of the clock.

Moreover, when the circuit operates at high frequency, and a skew occurs between the clock signal CLOCK and the data, there exists a delay because the inverted clock signal /CLOCK of the clock signal is one passed through the inverter I1. At this time, if a skew occurs between the inverted clock signal /CLOCK of the clock signal and the data, there exists a problem in that the data outputted from the rising and falling edges of the clock collide each other, thereby causing a malfunction in the circuit.

SUMMARY OF THE INVENTION

It is an object of the present invention to solve the problems involved in the prior art, and to provide a clock sync latch circuit into which two input signals both of which are opposite in polarity are inputted as being divided into respective input signals and which is controlled by either one of the two clock signals, thereby preventing collision between the data outputted from the rising and falling edges of the clock.

In order to achieve the above object, a clock sync latch circuit, according to the present invention comprises of a first and a second switching means for controlling two input signal having opposite polarities which are opposite in operation to each other by one clock signal so as to be the first and second nodes, respectively; a first latch means is connected between the first and second nodes; first and second inverting means for inverting the voltage levels of the first and second nodes; third and fourth switching means for controlling the outputs from the first and second inverting means which are opposite in operation to each other by the clock signal; a second latch means connected between the third and fourth nodes; and first and second output means for outputting the voltage levels of the third and fourth nodes, respectively;

Also, the first, second, third and fourth switching means are implemented as MOS transistors, the first and fourth switching means are implemented as PMOS transistors, and the second and third switching means are implemented as NMOS transistors. In addition, the first and fourth switching means are implemented as NMOS transistors, and the second and third switching means are implemented as PMOS transistors.

The first, second, third and the fourth switching means includes MOS transistors. Also, the first and fourth switching means are implemented as PMOS transistors, and the second and third switching means are implemented as NMOS transistors. Additionally, in the clock sync latch circuit, the first and fourth switching means are implemented as NMOS transistors, and the second and third switching means are implemented as PMOS transistors.

BRIEF DESCRIPTION OF THE DRAWINGS

The above object, and other features and advantages of the present invention will become more apparent by describing the preferred embodiment thereof with reference to the accompanying drawings, in which.

DETAILED DESCRIPTION OF PREFERRED EMBODIMENTS

Below, one embodiment of the present invention will be explained in detail with reference to the accompanying drawing.

Figure 1:
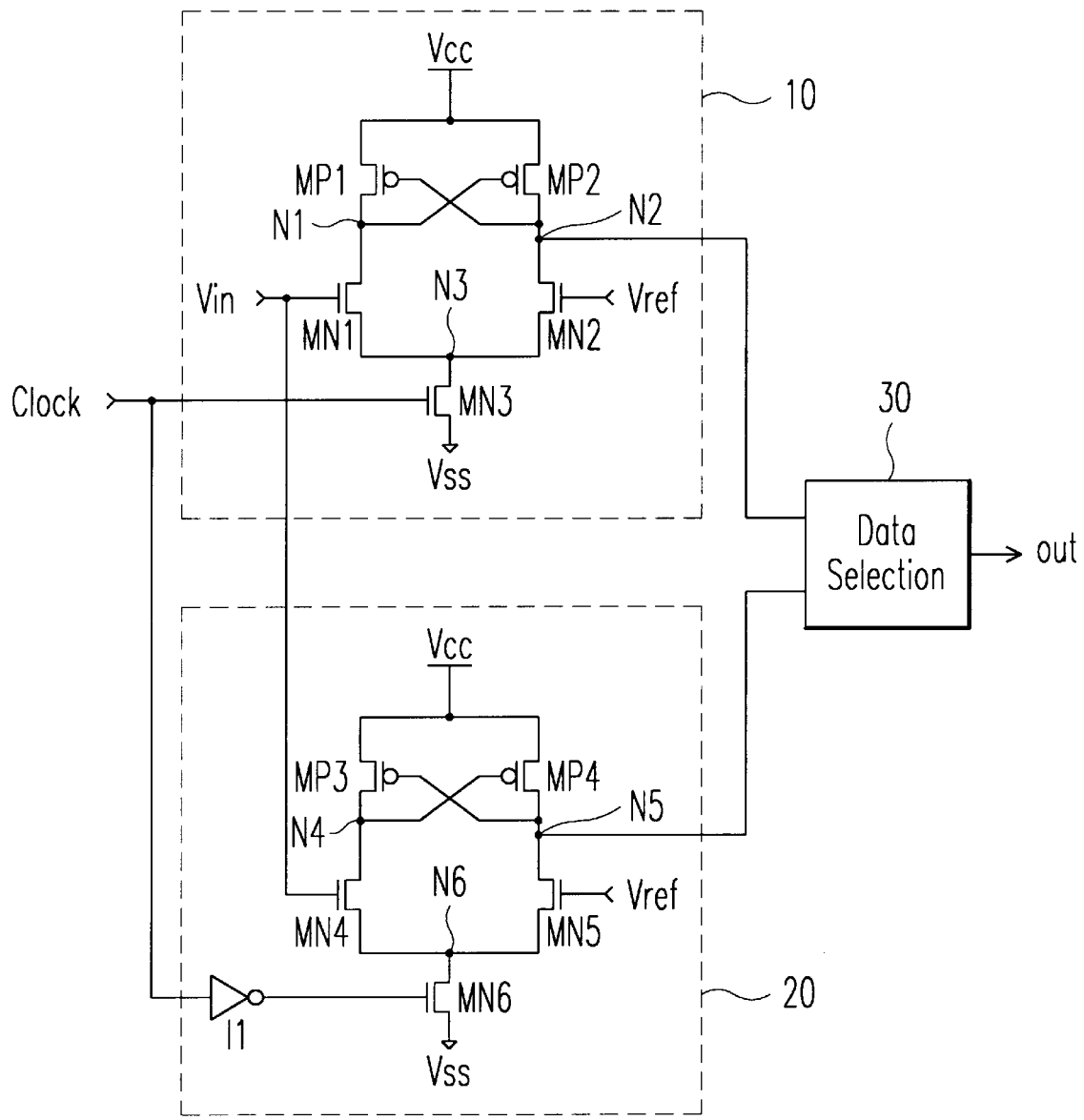
FIG. 1 is a conventional latch circuit.
Figure 2:
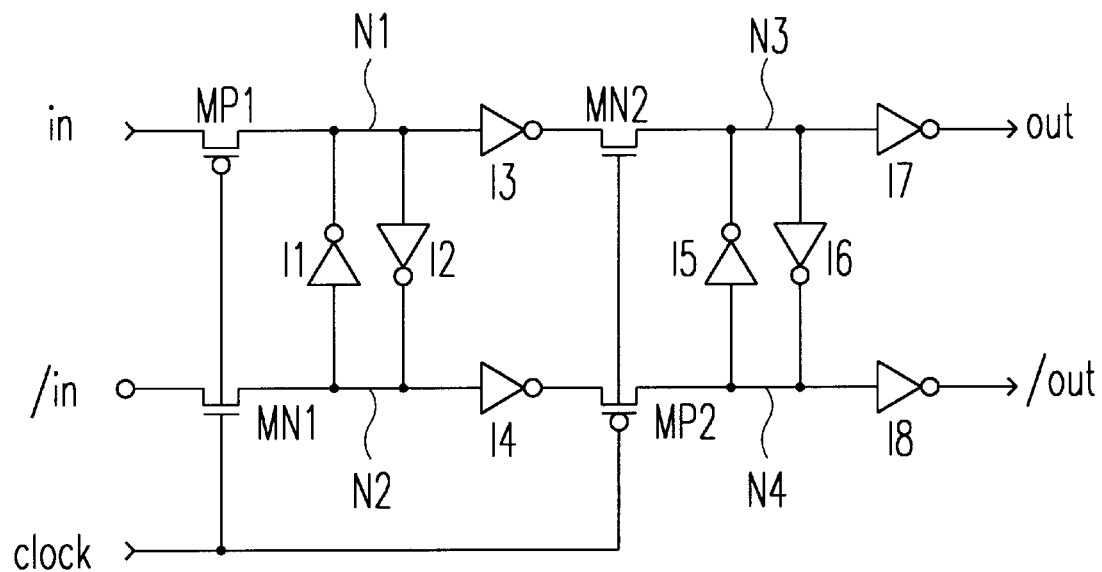
FIG. 2 is a clock sync latch circuit according to one embodiment of the present invention.

Referring now to FIG. 2, shown is a clock sync latch circuit according to one embodiment of the present invention. The clock sync latch circuit of the present invention includes a first P channel MOS transistor MP1 to the gate of which a clock signal CLOCK is applied and connected between a terminal for providing an input signal IN and a first node N1; a first N channel MOS transistor MN1 to the gate of which the clock signal CLOCK is applied and connected between the terminal for providing an inverted input signal /IN where the polarity of which is opposite to that of the input signal IN and a second node N2; a first inverter I1 for inverting the signal of the first node N1 to transmit the result to the second node N2; a second inverter I2 for inverting the signal of the second node N2 to transmit the result of the first node N1; a second N channel MOS transistor MN2 to the gate of which is applied the clock signal CLOCK for transmitting the inverted signal of the first node N1 to a third node N3; a second P channel MOS transistor MP2 to the gate of which is applied the clock signal CLOCK for transmitting the inverted signal of the second node N2 to a fourth node N4; a third inverter I3 for inverting the signal of the third node N3 to transmit the result to the fourth node N4; a fourth inverter I4 for inverting the signal of the fourth node N4 to transmit the result to the third node N3; a seventh inverter I7 for inverting the signal of the third node N3 to transmit the result to an first output terminal OUT; and an eighth inverter I8 for inverting the signal of the fourth node N4 to transmit the result to a second terminal /OUT.

In the clock sync latch circuit as constructed above, if the CLOCK signal is at a rising edge, the first and second N channel MOS transistors MN1 and MN2 are turned on and the first and second P channel MOS transistors MP1 and MP2 are turned off. The inverted input signal /IN is thereby transmitted to the second node N2 via the first N channel MOS transistor MN1 which is turned on, and the signal of the second node N2 is transmitted to the first node N1 via the second inverter I2. Then, the signal of the first node N1 is transmitted to the third node N3 via the second N channel MOS transistor which is inverted to be turned on by the third inverter I3. As a result, the input signal IN is outputted to the first output terminal OUT via the seventh inverter I7.

On the other hand, if the CLOCK signal is at a falling edge, the first and second P channel MOS transistors MP1 and MP2 are turned on and the first and second N channel MOS transistors MN1 and MN2 are turned off. The input signal IN is thereby transmitted to the first node N1 via the first P channel MOS transistor MP1 which is turned on, and the signal of the first node N1 is transmitted to the second node N2 via the first inveter I1. Then, the signal of the second node N2 is transmitted to the fourth node N4 via the second P channel MOS transistor MP2 which is inverted to be turned on by the fourth inverter I4. As a result, the inverted input signal /IN is outputted to the second output terminal /OUT through the eighth inverter I8.

Therefore, since separate two input signals IN, /IN opposite in polarity to each other are inputted separately, the two input signal IN and /IN are respectively outputted from each of the rising and falling edges of the clock. That is, if the clock signal CLOCK is at a rising edge, the input signal IN is outputted to the first output terminal OUT. On the other hand, if the clock signal CLOCK is at a falling edge, the inverted input signal /IN is outputted to the second output terminal /OUT.

Thus, even though a skew in a memory chip occurs, the possibility of collision between the data outputted from the rising and falling edges of the clock when the memory chip operates at high frequency can be prevented since it is synchronized by a same clock signal CLOCK, thus preventing a malfunction of the memory chip.

As described above, according to the clock sync latch circuit of the present invention, since two input signals having opposite polarities to each other are synchronized by a same clock signal to be outputted from the rising and falling edges of respective clocks, the danger of collision between the data when a memory chip operates at high frequency can be greatly reduced, thereby providing an outstanding effect of preventing a malfunction of the entire chip.

Also, it affects the design and manufacturing cost positively since it uses only single latch circuit.

While the present invention has been described and illustrated herein with reference to the preferred embodiment thereof, it will be understood by those skilled in the art where various changes in form and details may be made therein without departing from the spirit and scope of the invention.

What is claimed is:

1. A semiconductor memory device, comprising:

first and second switching means for controlling two input signal having opposite polarities which are opposite in operation to each other by one clock signal so as to first and second nodes, respectively;

a first latch means is connected between the first and second nodes;

first and second inverting means for inverting the voltage levels of the first and second nodes;

third and fourth switching means for controlling the outputs from the first and second inverting means which are opposite in operation to each other by the clock signal;

a second latch means connected between the third and fourth nodes; and first and second output means for outputting the voltage levels of the third and fourth nodes, respectively.

2. A semiconductor memory device as claimed in claim 1, wherein the first, second, third and fourth switching means are implemented as MOS transistors.

3. A semiconductor memory device as claimed in claim 1 or 2, wherein the first and fourth switching means are implemented as PMOS transistors, and the second and third switching means are implemented as NMOS transistors.

4. A semiconductor memory device as claimed in claim 1 or 2, wherein the first and fourth switching means are implemented as NMOS transistors, and the second and third switching means are implemented as PMOS transistors.

* * * * *